United States Patent [19]

Heiart et al.

[11] Patent Number: 4,522,903

[45] Date of Patent: Jun. 11, 1985

[54] SEQUENTIAL AUTOMATIC REGISTRATION AND IMAGEWISE EXPOSURE OF A SHEET SUBSTRATE

[75] Inventors: Robert B. Heiart, Middletown; Abraham B. Cohen, Springfield, both of N.J.

[73] Assignee: E. I. Du Pont de Nemours and Company, Wilmington, Del.

[21] Appl. No.: 387,536

[22] Filed: Jun. 11, 1982

[51] Int. Cl.$^3$ .............................................. G03F 9/00
[52] U.S. Cl. .................................. 430/22; 430/291; 430/293; 430/319; 430/322; 430/327; 430/396; 430/394
[58] Field of Search ................. 430/22, 327, 291, 322, 430/325, 326, 396, 293, 935, 394

[56] References Cited

U.S. PATENT DOCUMENTS

| | | | |
|---|---|---|---|
| 3,547,730 | 12/1970 | Cohen et al. | 156/345 |
| 3,573,975 | 4/1971 | Dhaka et al. | 430/22 |
| 4,201,581 | 5/1980 | Thomas et al. | 430/396 |
| 4,281,922 | 8/1981 | Matsumoto | 355/99 |
| 4,334,009 | 6/1982 | Charles et al. | 430/291 |

FOREIGN PATENT DOCUMENTS 48-29727 9/1973 Japan.
54-69076 2/1979 Japan.

OTHER PUBLICATIONS

Tokyo Ohka Kogyo Co., Ltd., Sep. 1981, YN2000, Japan.

*Primary Examiner*—John E. Kittle
*Assistant Examiner*—José G. Dees

[57] ABSTRACT

Method for repetitive registering and imagewise exposing to actinic radiation a sheet substrate containing a photosensitive layer with use of a sequence of related photomasks. A liquid layer separates the photosensitive layer and each photomask during the exposure step.

27 Claims, 2 Drawing Figures

SEQUENTIAL AUTOMATIC REGISTRATION AND IMAGEWISE EXPOSURE OF A SHEET SUBSTRATE

BACKGROUND OF THE INVENTION

There is a continuing need in the printed circuit, graphic arts, and other related industries, to transfer images photographically from a sequence of original (positive or negative) photomasks to one or both sides of a light sensitive sheet support. There is a particular need to prepare four-color surprint proofs from original artwork using suitable photomasks. In making the surprint proof, for example, it is very important to align each photomask with the preceding image so that the final image is precisely in register with the preceding image. There is also a need to make multilayer circuit boards on one or both sides of a support also using a multitude of photomasks. In the case where multilayered printed circuit boards are being made with multiple images on one or both sides of the board, it is also important to precisely register these images with each other. In all instances, the photographic process must be carried out in a manner which maintains the definition, location and image features of the original and minimizes the image dislocation. Finally, it is important to automate as much of this process as possible in order to reduce operator handling and improve reproducibility.

Four-color surprint proofs can be prepared as taught for example in U.S. Pat. No. 3,649,268 and U.S. Pat. No. 3,854,950 (positive working process) and U.S. Pat. No. 4,174,216 (negative working process). In these processes, a photopolymer film element is first laminated to a suitable support such as paper card stock. This film is then given an imagewise exposure to actinic light through one of four photomasks (e.g. color separation films representing each of the four colors from the original artwork) which bears one of the primary colors. Normally, a vacuum frame device is used during the exposure process to insure good photomask/photosensitive layer contact. In the positive working proces, the photopolymer film is inherently tacky and those areas struck by light during exposure, harden and become less tacky. In the negative working process, the photopolymer film is associated with a tacky, adherent layer and exposure causes the photopolymer layer to fracture imagewise. When the cover layer associated with this structure is then peeled off, the exposed areas relative to this process are removed uncovering imagewise areas of the tacky adherent layer. The remaining, unexposed areas are not tacky. In both of these processes, the final image is developed by applying a colored, powdered toner to the tacky areas. The color of the toner should correspond to the color recorded in the photomask image. The toner adheres to the tacky portion of the image revealing the copy. For each additional color record, an additional layer of photopolymer is laminated over the preceding image and exposed to its photomask. Each exposure must be made in precise registry with the preceding exposure in order to maintain the correct image location. Typically, a set of four photomask image records using colored, powdered toners of yellow, magenta, cyan and black are used to prepare a final image in this sequential operation. This process, then, will produce an exact surprint proof of the original artwork and is an excellent method for proofing originals for the printing industry. Each colored toner can be matched closely to the desired printing ink and thus the process is very useful. It is desirable to automate the surprint making process since the need to expose each photomask in a vacuum frame apparatus is time consuming. Additionally, registration of each record is difficult to do by hand and even more difficult to automate.

Multilayer printed circuit boards can also be prepared by a sequential image transfer process using a dry photopolymer film and an additive plating process such as that described in U.S. Pat. Nos. 4,054,483; 4,054,479; and 4,157,407. In the general processes described in these patents, a photopolymer film element is laminated to a sheet substrate material (e.g., a thin insulated board) and the photopolymer layer is exposed imagewise to actinic radiation through a photomask bearing a printed circuit image. When the sheet substrate contains circuit components such as through-holes or a circuit conductor pattern, the photomask must first be registered to the component before the exposure step. Either the imaging exposure itself, or subsequent process steps will produce adherent image areas on the laminated substrate into which powdered catalyst can be suitably imbedded. The powdered catalyst (e.g., copper powder) is then applied to the imaged surface to produce a catalytic circuit pattern which is then plated (e.g., with an electroless plating bath). These process steps will produce a highly conductive circuit pattern from the original artwork. For each additional layer of circuitry needed to complete the multilayered circuit, a fresh photopolymer film is laminated to the surface of the previously imaged and plated laminate, exposed again imagewise to its photomask which is held in precise registry with the previous image, and the entire process outlined above repeated. Using this process, multiple circuit layers can be applied to one or both sides of a substrate and circuit layer interconnections and through-holes can be formed.

Typically, manual transfer and positioning of the substrate element has occurred between each step of the process described above. The steps of application of the catalyst are also carried out by hand. Attempts have been made to automate these processes but this has been adopted only to a limited extent such as the application of the catalyst. Automation will result in a substantial cost savings to the user and is a highly desirable feature. Nevertheless, many of the above-described steps of this process remain labor intensive and prone to human error. This is particularly true of the registration and exposure steps.

Contact printing is virtually the universal method of exposure used today in the surprint proof and printed circuit photofabrication industries despite certain known shortcomings. Although low in equipment costs, simple to use, and capable of excellent line and halftone definition, contact printing is labor intensive and slow because of the previously mentioned vacuum frame drawdown times. It is also subject to losses due to damaged and dirty photomasks resulting from repeated use. This, in turn, requires frequent and expensive touch up and replacement of expensive photomasks to avoid yield losses. Much time is also lost in the constant and tedious process of inspecting the photomasks for defects between exposures. In addition, variations in frame temperature and ambient humidity affect corner-to-corner registration, especially when using larger formats.

Alternative exposure methods such as gap printing, projection printing and laser scanning each offer some significant advantages over contact printing. However, in the current state of development, all have serious limitations for high productivity applications and are intrinsically higher in equipment costs.

SUMMARY OF THE INVENTION

The present invention is directed to a process for registering and imagewise exposing a sheet substrate containing a photosensitive layer, with the use of a sequence of related photomasks comprising the steps of:
(1) advancing the substrate containing a photosensitive layer to a position in a device to undertake either in order or concurrently the steps of:
   (a) aligning the substrate and a photomask of the sequence in a predetermined relationship to one another,
   (b) applying a liquid between the photosensitive layer and the photomask;
(2) contacting through the liquid the substrate containing the photosensitive layer and the photomask whereby during said contacting substantially no movement of the photosensitive layer relative to the photomask occurs other than a more intimate contact due to displacement of the liquid in a liquid layer whereby at least one of interfacial or viscous force due to the liquid layer aids in holding the photosensitive layer and photomask in a fixed position relative to one another;
(3) exposing the photosensitive layer to actinic radiation through said photomask causing an image to be formed thereon;
(4) removing the photomask from the exposed photosensitive layer;
(5) modifying the surface of the exposed photosensitive layer;
(6) repeating steps 1 to 5 for each of the remaining photomasks of said sequence.

In particular embodiments of this invention the surface of the exposed photosensitive layer may be modified by an image intensification step, e.g., such as embedding image areas with a powdered toner or catalyst and/or by applying a second photosensitive layer thereto. In yet another embodiment of this invention, both sides of the substrate contain photosensitive layers and the process steps outlined above occur simultaneously to both photosensitive layers.

DETAILED DESCRIPTION OF THE INVENTION

In the process of this invention a substrate containing a photosensitive layer with or without a top support sheet is introduced into a registration and exposure device.

The photosensitive layer composition preferably comprises a photopolymerizable composition which can be negative or positive working. Conventionally the substrate is rectangular. The registration portion of the apparatus consists of one or two film elements, preferably rectangular and flexible, at least one of which is a photomask. The leading edges of the elements can be joined in parallel, hinged, relationship on each side of a thin rectangular carrier whose thickness approximates the thickness of the photosensitive sheet. The hinged relationship maintains the registration between the photomasks and the carrier. When both film elements are photomasks, they are maintained in precise register with each other by virtue of their hinged relationship to a common carrier. The apparatus disclosed in concurrently filed application Ser. No. 387,534, filed June 11, 1982 can be employed in the present invention except it is ordinarily necessary to employ a different photomask when each photosensitive layer of a sequence is to be registered and exposed.

With the photomasks hinged outward from the carrier, the sensitized substrate is positioned or aligned between the film elements so that one substrate edge is in registration contact and approximately parallel to the length of the carrier. In some instances registration contact can be simple edge-to-edge contact of the substrate with the carrier wherein the only added criterion is that the image pattern portion of the photomask is completely contained within the area of the sheet to be imaged. However, registration contact more generally requires the precise alignment of details contained on the photosensitive sheet of the substrate with details of the photomask image or images. In this instance at least two contact points on or in the sheet are brought into a fixed relationship wth two corresponding contact points fixed to the carrier. Such points may be notches and tabs suitably spaced on the sheet and carrier edges. Alternatively the points may consist of registration pin and hole combinations wherein the sheet contains precision drilled registration holes which are positioned in the desired orientation to the bar by registration pins. For each substrate the registration is substantially identical from photomask to photomask to obtain after suitable processing a series of differently exposed photosensitive layers precisely registered on the substrate to produce a composite imaged element.

Once the substrate containing the photosensitive layer is in registration relationship to the carrier, the flexible film photomasks can be applied to at least one side of the substrate containing the photosensitive layer in the presence of a liquid interface by applying normal pressure in a line roughly parallel to the carrier on the outer surfaces of the photomasks at or near the hinged edges and advancing (relatively) the pressure line in the direction perpendicular to the hinge line and parallel to the sensitized substrate surface and, concurrent with the advance, applying the liquid, e.g., by spraying, to the nip between the substrate and the inner surface of the photomask formed by the advancing pressure line. In effect a photomask is temporarily wet laminated to a side of the substrate to give a registered sandwich structure in which the substrate is separated from each photomask surface by a liquid interface. This lamination process step is preferably carried out by passing the hinged photomask-registered sheet assembly through a pair of pressure rollers. In this mode of operation, pressure is applied at or near the hinged leading edge of the substrate and the flexible photomasks and the trailing portions of each photomask wrap partially around the curved surface of each pressure roll. Liquid, preferably water, is then sprayed into the two nips on each side of the substrate. Preferably, the registration apparatus is oriented so that the general direction of the wet lamination is upward, i.e., the substrate travels in an upward direction relative to the pressure rolls and liquid applicators. When so oriented, a cleaning action of the liquid can be achieved on both the photomask and the photosensitive layer or support sheet which is enhanced by the use of excess liquid directed at both surfaces and which will simply drain into a catching basin carrying any extraneous matter with it. In addition, the area above the pressure rolls where actinic exposure preferably occurs can more easily be kept free of unwanted liquid. This process of obtaining alignment of a substrate and photomask is obtained without the use of vacuum. However, a vacuum can be used to remove excess liquid.

It is understood that in the present specification "substantially no movement" means that surfaces of the photosensitive layer and the photomask do not move relative to one another in directions parallel to their surfaces, i.e., the surfaces do not slide relative to one another to change the alignment of the photomask to the substrate. However, it is understood that "substantially no movement" allows relative movement of the photomask and the photosensitive layer in the direction perpendicular to their surfaces to form a more intimate contact, e.g., as liquid is squeezed from the interface between the photosensitive layer and the photomask. However, the photosensitive layer and photomask, already contacted by the advancing pressure line, will remain in a fixed relationship in directions parallel to their surfaces.

Also it is understood that in the present specification "contacting" through the liquid layer a substrate containing a photosensitive layer and a photomask does not exclude intermediate layers. For example the photosensitive layer may have a support sheet which allows actinic radiation to pass or the photomask may contain a release coating. Such support sheet or release coating could contact the liquid layer.

In the present specification a photosensitive layer is employed to mean a preformed layer and excludes a photosensitive layer present as a liquid.

Once a photomask has been fixed in register over the photosensitive layer, the substrate with its photosensitive material may be exposed to any source of radiation actinic to the photosensitive material for a prescribed period of time. In a preferred mode of operation, the laminated element emerges from the pressure rollers, is stopped and suspended in a fixed upright position and uniformly exposed to actinic radiation in the 3000 to 4000 Å or above region. When both sides of the substrate are photosensitive, both sides preferably are exposed simultaneously. In an alternative mode of operation, the sensitized substrate is irradiated with actinic radiation as it emerges from the pressure rolls and is carried past the irradiation region. In this mode, the irradiation may be focused to a band or a transversely scanned spot of intense actinic radiation may be used whose intensity is adjusted to match the exposure characteristics of the photosensitive surface and the rate of transport. It is also possible to completely remove the sensitized substrate from the registration device and expose it on any suitable exposure unit. In this instance the photomasks and carrier remain fixed in registration with the photosensitive layer by the action of surface or viscous forces induced by the interface liquid. It is understood that both surface and viscous forces may be present.

In the above process steps the rectangular, flexible film elements have been identified as photomasks. When both sides of an element to be imaged are photosensitive, as with two sided circuit boards, both film elements contain opaque and transparent image areas. However, when only one side of a photosensitive element is to be imaged, e.g., a one-sided circuit board, only one film element (of a pair, if present) is required to be a photomask.

When imaging exposure is complete, the photomask is peeled from the surface of the exposed photosensitive element thus releasing the imaged element from registration. The imaged element is then transferred from the registration-exposure apparatus and the hinged photomask-carrier assembly is returned to its initial position. After the photomask is removed from the exposed photosensitive layer the surface of the exposed photosensitive layer is modified by an image intensification or fixing step and/or by applying an additional photosensitive layer hereto. Typical image intensification steps include toning by embedding finely divided particulate material directly into tacky image areas produced on the photosensitive layer, e.g., such as with colorants as described in Chu and Cohen U.S. Pat. No. 3,649,268 and Abele et al. U.S. Pat. No. 4,243,741, or with catalytic or metal powders as disclosed in Peiffer U.S. Pat. No. 4,054,483. Alternative or additional intensification steps can be used such as dissolution development such as described in U.S. Pat. Nos. Peiffer, 4,054,483; Peiffer, 4,157,407; and Fan 4,053,313 or as so-called peel-apart development as described in U.S. Patents Cohen and Fan, Nos. 4,174,216 and 4,191,572. When dissolution or peel apart development are used, the photosensitive element may itself contain a colorant or have a photoformed colored image. Image intensifying or fixing processes can include uniform exposure of the imaged layer to the same or different actinic radiation or heat. In instances where a metallized or catalyzed image is formed the added steps of plating or soldering may be included. Image intensification by toning may include dry or liquid toners. In instances where surprints are formed the surface is typically modified by the application of additional photosensitive layers after some form of image intensification as described above has been carried out. Thereafter the exposed photosensitive layer is processed, e.g., as taught in U.S. Pat. Nos. 3,649,268, 3,854,950 and 4,174,216 in making a four color surprint proof or as taught in 4,054,483, 4,054,479 and 4,157,407 in making a multilayer circuit board.

In one mode, after the modification step a new photosensitive layer may be applied to the processed imaged layer and registration and exposure step may be repeated. In a preferred mode of operation, after exposure, the pre-exposure process steps, for the most part, are reversed. Thus the exposed laminated element passes back through the pressure means such as rollers and the photomask is pulled back over its respective pressure roller into a storage area until the hined area on the carrier is reached. Other means than rollers may be used to apply pressure, e.g., a squeegee.

The sheet substrate during the registration and imagewise exposure process may be in any orientation including a horizontal plane or vertical plane. Preferably the substrate will be in a substantially vertical plane. In the process of this invention any means can be used to convey the substrate to and from the registration position in the apparatus.

The liquid which is applied to the photosensitive layer or support sheet and photomask serves several vital functions in the process of this invention. The liquid serves to uniformly fix the photomask in intimate registered contact to the photosensitive surface or support sheet during actinic exposure and after exposure allows the photomask to be easily removed from the exposed sensitized substrate without damage or transfer of either. The excess liquid serves to clean the surface of the photomasks and individually clean each photosensitive surface or support layer thus preventing deterioration of the photomask image and/or the resulting exposed image particularly by element born dirt. Besides these vital functions the liquid also serves to condition and cool the photomask during the exposures. By spraying liquid on the photomask, the environment and temperature of the photomask is maintained constant and less susceptible to changes in ambient temperature or humidity. In this respect, it is also desirable to spray liquid on the exterior surface of the photomask, provided the liquid forms a uniform film on the exterior surface or is removed therefrom before actinic exposure. The liquid interface should be substantially transparent to actinic radiation and should not damage the photomask (or the photosensitive sheet surfaces or cover sheet unless surface modification is desired). Also it should not interfere with the exposure of the photosensitive layer. The liquid should preferably wet both surfaces of the photomask and photosensitive layer or support sheet, have low volatility at ambient temperatures, and have sufficient viscosity to fulfill the vital functions of the liquid. The preferred liquid is water or aqueous solutions containing adjuvants which improve liquid characteristics, e.g., surface active agents, viscosity adjusting agents, etc. Other liquids, of course, can be used depending on the conditions required, e.g., alcohols, glycols, glycol ethers, halogenated hydrocarbons, paraffins, etc., provided they fulfill the above criteria. Since the liquid remains a liquid after the exposure step, a photosensitive liquid is not used for this component of the process.

The process of this invention is useful for imaging any substrate containing a photosensitive layer which is compatible with the liquid treatment. If the photosensitive composition is not compatible with the liquid, preferably a support or cover sheet is used to protect this composition. In such case the support sheet will contact the liquid. The process is particularly useful for exposing elements having a photopolymerizable surface or surfaces which are typically used for producing multilayer printed circuit boards, or four-color surprint proofs.

The registration and imagewise exposure process of the present invention is applicable to a wide variety of sheet substrates provided at least one surface contains a photosensitive layer which may have an optional support or cover sheet. In one mode, opposite surfaces of the sheet substrates carry photosensitive layers with the registration and imagewise exposure performed simultaneously or substantially simultaneously on both surfaces.

In one of the modes of the invention, the sheet substrate will contain a smooth surface, e.g., paper card stock, onto which the photosensitive layer is laminated. Alternatively, the substrate surface onto which the photosensitive layer is laminated may contain circuitry in relief and need not be smooth. In such case, the registration and imagewise exposure process can take place in similar fashion to a smooth surface, including simultaneous or substantially simultaneously registration and imagewise exposure of opposite surfaces which have photosensitive polymer layers.

The compositions of substrates and the compositions of the photosensitive layers are well known in the art, e.g., in the patents referred to previously and also in concurrently filed application Ser. No. 387,534 filed July 11, 1982.

Figure 1:
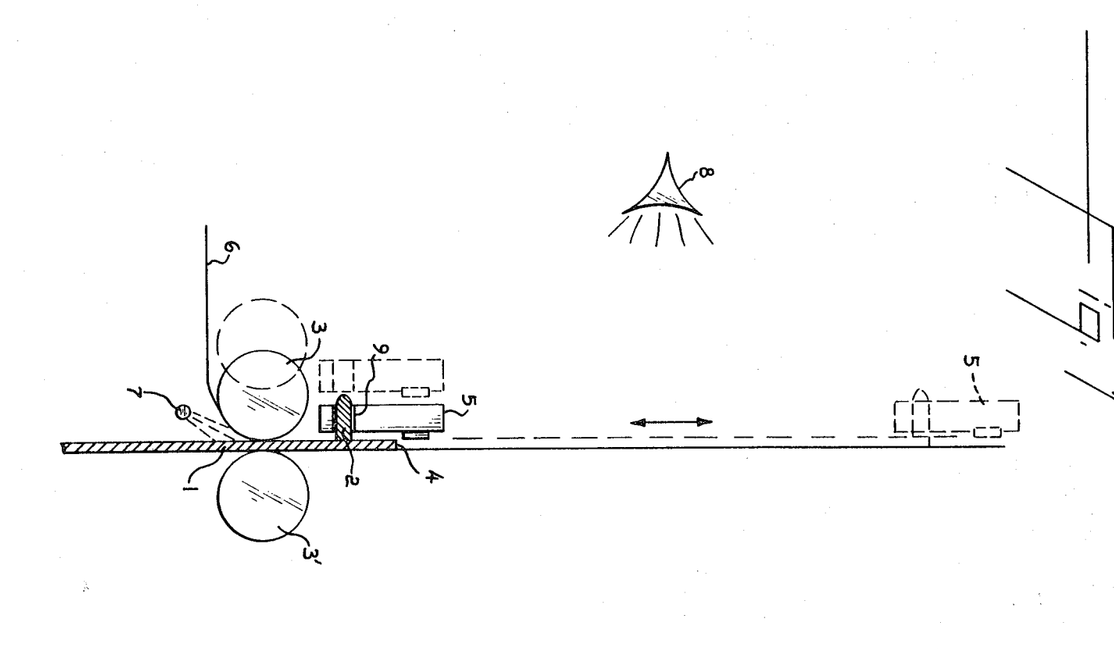
FIG. 1 shows a side view of apparatus useful in the process of this invention applying a photomask in registry with a substrate having a photosensitive layer applied to only one side.

FIG. 1 is a pictorial representation of an apparatus useful in carrying out the process of the invention. This process will now be described with reference to this apparatus. In this process, a substrate with a photosensitive layer and its corresponding set of photomasks are aligned and punched (or drilled) along one edge using a commercially available punch (or drill). The prepunched sensitized substrate designated as (1) is taken, and the holes in its leading edge are fitted over the corresponding pins in pin registration set (2). The punched photomask (6) is then affixed in a parallel, hinged relationship to photomask carrier (5) the prepunched holes in the photomask (6) corresponding to the registration pin receiving hole (9) in carrier (5). The photomask carrier (5) is then lowered and registered to substrate (1) using pin registration set (2). (Alternatively a photomask with holes can fit on the same pins as the substrate.) Stop pins (4) are retracted and nip rolls (3) and (3') are then activated bringing upper roll (3') in contact with lower roll (3) thus forming a nip between the substrate (1) and photomask (6). Since FIG. 1 is only a side view, only one pin in the registration pin set and one hole is shown. In reality, two or more holes are present in the photomask carrier and a like number of pins in the registration pin set are provided. Liquid spray (7) is turned on so liquid is sprayed at the nip formed between the photomask (6) and the substrate (1). The substrate (1) in register with photomask (6) is then moved to the exposure position (5'), and exposed using exposure unit (8). Intimate contact is achieved prior to exposure by squeezing out the excess liquid between substrate (1) and photomask (6) with the aid of nip rolls (3) and (3'). After exposure the mechanism is reversed. Substrate (1) in register with photomask (6) is moved back, nip rolls (3) and (3') are moved apart, photomask carrier (5) is lifted so it is out of contact with the pins in registration pin set (2) and the exposed substrate (1) and photomask (6) are released. The process is then repeated, e.g., after applying a new photosensitive layer to the substrate, using a remaining photomask of the set.

Figure 2:
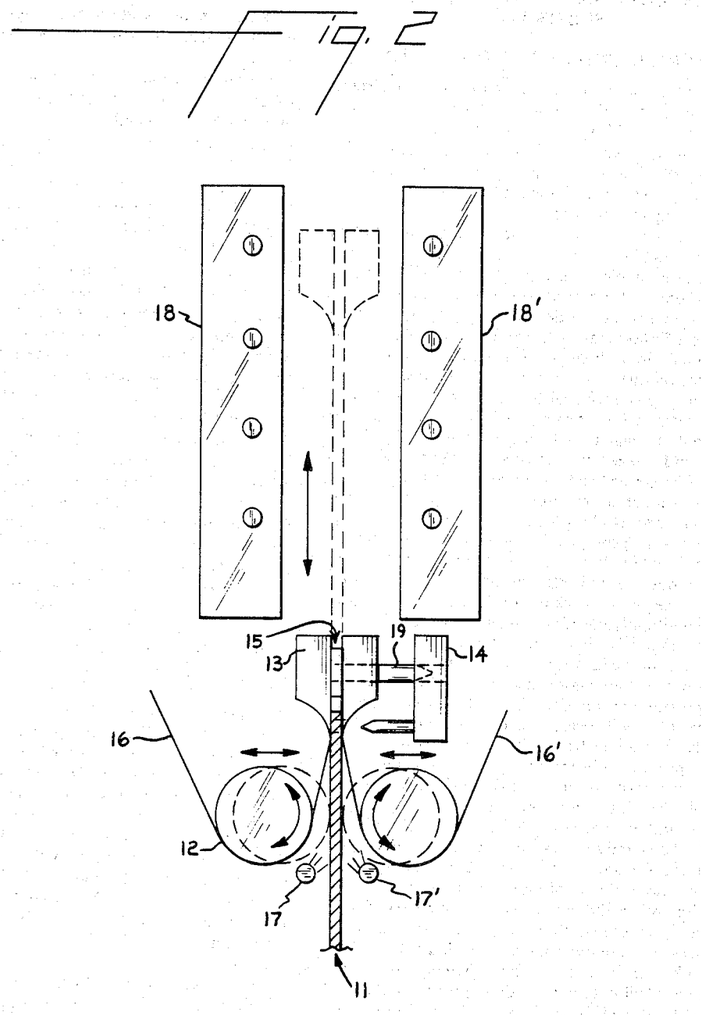
FIG. 2 shows a side view of the process of this invention applying photomasks in registry with a substrate having photosensitive layers applied to both sides thereof.

In FIG. 2, is shown a registration and imagewise exposure process in a vertical mode. The substrate contains photosensitive layers on both sides and at least 2 pin register holes along its leading edge. Before a substrate is introduced, the following conditions are established:

Nip rolls (12 and 12') are open;
Clamp (13) is open;
Photomask assembly (15) which contains a pair of matching photomasks (16 and 16') and its carrier is registered to clamp (13) by carrier register pins (19) with the photomasks kept taut around nip rolls (12 and 12');
Pin register bar (14) is not engaged;
Liquid spray (17 and 17') is on; and
Exposure Sources (18 and 18') is on standby. Substrate (11) is then lifted up to register position inside clamps (13) through nip rolls (12 and 12'). Pin register bar (14) closes; first engaging carrier register pins (19)

on clamp (13) and then picking up predrilled register holes (not shown) on substrate (11) with its own pins. Registration of substrate (11) to photomasks assembly (15) is achieved when the pins are engaged. Next clamp (13) is closed to maintain registration and pin register bar (14) is subsequently retracted. Clamp (13) is moved down, carrying photomask assembly (15) and substrate (11) to nip rolls (12 and 12'). Then nip rolls are closed and clamp (13) is moved up to exposure position (18). Intimate contact of photomasks (16 and 16') and substrate (11) is achieved by squeezing out excess liquid with nip rolls (12 and 12'). Exposure on both sides is made. After the exposure, the mechanism is reversed, clamp (13) moves down to its initial registered position and then both it and nip rolls (12 and 12') are opened. The exposed substrate (11) is released to allow processing, e.g., with toner and application of new photosensitive layers and the process is then repeated using remaining photomasks in a set. Although imaging exposures of both sides are depicted in FIG. 2, it is apparent that imaging exposure of only one side may also be carried out using the apparatus disclosed.

This invention will now be illustrated by the following specific examples of which Example 1 is considered to be the best mode. All parts are by weight unless otherwise included.

EXAMPLE 1

This example demonstrates the making of a positive four-color surprint proof using multiple layers and exposures in registry and is illustrated schematically by FIG. 1.

A photosensitive composition similar to that described by Held, U.S. Pat. No. 3,854,950, Example II, is prepared and coated by means of a 0.003 inch doctor knife on a 0.001 inch thick polyethylene terephthalate film support at room temperature. This material is allowed to dry at room temperature and a sample of the dried film is laminated at 100° C. to the smooth side of a Kromkote® cast-coated one side cover paper support (the Champion Paper and Fiber Company) using heated, pressure rollers. A sample of 0.001 inch thick tacky polyethylene terephthalate film is laminated to the other side of the paper support to protect the support during the processing steps to image the photopolymer layers on the opposite side thereof. The resulting composite support/photopolymer element is designated as the support (1) in FIG. 1 and is then placed in the position shown in the drawing. Nip rolls (3) and (3') are then activated. Roll (3) is lowered onto the support causing registration pin (2) to enter through a prepunched hole in the support and into a like hole matched in registration in the photomask carrier (5). Since FIG. 1 is only a side view of this embodiment, only one pin set and one hole is shown. In reality, two or more holes are present in the carrier and are prepunched in the support and a like number of pin sets are provided to fit same. A photomask (6) containing the blue record image of a four-color separation image (the yellow Printer Positive) is attached to carrier (5) and extends around the upper nip roll (3) as shown. The upper nip roll is shown in the raised position (dashed lines) and in the lowered, contacting position (solid line). Water is applied between the photopolymer layer on the substrate and the photomask. In this particular example, the sheet of polyethylene terephthalate on which the photopolymer is coated still remains on the composite element as a cover sheet. Thus, the water is applied between this cover sheet and the photomask. After water is applied and the upper nip roll lowered, the stop pin (4) is removed and the carrier transported (means not shown in this drawing) into an area directly under the light source (8). The light source is a Berkey-Ascor Vertical exposure source using a 2 KW photopolymer lamp and a Kokomo® No. 400 glass filter (Kokomo Opalescent Glass Co., Kokomo, IN) and a 30 second exposure is given with the light source at a distance of 38 inches from the photomask/photopolymer surface. The application of water between the photomask and photopolymer allows superb image contact with thr photosensitive element and thus excellent resolution is achievable. After exposure, the procedure is reversed and the substrate containing the now exposed photopolymer layer is removed from the automatic registration and exposing device. The cover sheet is removed from the photopolymer layer and toner of ca. 30% Dalamar Yellow (C.I. Pigment Yellow 74) in ca. 70% cellulose acetate is applied using a cotton pad. The excess toner is removed by wiping with a cloth and a positive yellow image is left on the photosensitive layer. This image is a duplicate in yellow or a positive of the photomask. A second layer of the same photopolymer is then laminated over the yellow image and the photomask in the automatic registration and exposure device is replaced with one containing the green record image of the four-color separation (the Magenta Printer Positive). The substrate is again inserted into the automatic registration and exposing device and transported in liquid contact with this second photomask as previously described. The exposure is repeated and the substrate removed from the device and the cover sheet is removed. The resulting image is developed by applying a magenta toner comprising ca. 30% quinacridone magenta (C.I. Pigment Red 122) in ca. 70% cellulose acetate to reveal a magnetic image over the previous yellow image. Another layer of the same photopolymer is laminated over the two-color material and the photomask is replaced with the red record image of the four-color separation (the Cyan Printer Positive) and the processes described above repeated. After removal of the cover sheet the image is developed by toning with ca. 25% phthalocyanine blue (C.I. Pigment Blue 15) in ca. 75% cellulose acetate toner. A fourth photopolymer layer is then laminated over this three-color image and the photomask is replaced with the Black Printer Positive of the four-color separation and the entire process repeated for yet a fourth time. After removal of the cover sheet the final image is developed by toning with ca. 25% carbon black (C.I. Pigment Black 7) also dispersed in ca. 75% cellulose acetate toner. The final image achieved by this example is to result in an excellent four-color surprint halftone positive of the original image.

EXAMPLE 2

Referring now specifically to FIG. 2, this example demonstrates the utility of the process of this invention wherein photomasks are used in registry with a support coated on both sides with photosensitive layers.

In this example, a photopolymerizable element is prepared comprising the following major ingredients:
- 40% of an unsaturated polyurethane having 0.5% unsaturation and a molecular weight of 1900;
- 20% of an acrylonitrile/butadiene/styrene copolymer having a specific gravity of ca. 1.07;
- 30% trimethylolpropane triacrylate;

5% benzophenone; and

5% 4,4'-bis(dimethylamino)benzophonone.

This composition is dissolved in methylene chloride and is coated on a suitable 0.001 inch thick polyethylene terephthalate film support which is strippable from the photopolymerizable layer. A 0.001 inch thick polyethylene cover sheet having less adherence to the layer than the support is laminated on the other side of the photopolymerizable layer to form a sandwich tacky element.

The polyethylene cover sheet is removed from the layer and the surface just uncovered is laminated by means of heated, pressure rollers to a typical glass-epoxy G-10 circuit board (see Printed Circuits Handbook. edit. by C. F. Coombs, Jr., McGraw-Hill Book Co., 1967, pages 2–18). In the same manner, another portion of the same photopolymerizable element is laminated to the opposite surface of this board. This results in a double-side coated board. Through-holes are then introduced into the appropriate places in this composite element using a high speed (ca. 15,000 rpm) drill and an appropriate drill bit. The board surfaces are cleaned after this drilling operation to remove any bits of photopolymer that adhere to the surface. This cleaning is accomplished by wiping with a rag dampened with methylene chloride. The resulting composite element is shown as (11) in FIG. 2 and called the substrate. Complimentary contact positive transparencies (photomasks) of circuit patterns are then mounted in the automatic registering and exposing device and are shown as (16) and (16'). These photomasks are mounted on photomask assembly (15) above a pair of movable, opposable nip rolls (12) and (12'). Each photomask is aligned and prepunched to receive pin (11) attached to pin bar assembly (14). Concurrently, the pin bar assembly is set to receive pin (19) attached to the clamp (13). The substrate is also prepunched in the appropriate places to receive pins. It should be here noted that FIG. 2 is a side view of this embodiment and that other pins and holes are present along the length to permit perfect registration. When the device is actuated, liquid (water) from (17) and (17') is sprayed between the photosensitive layers on the composite element (11) and the photomasks (16) and (16') and the nip rolls (12) and (12') are closed. Concurrently, pins (20) and (19) engage into their respective holes prepunched through the composite substrate and the photomask and the holes provided in the clamps and pin sets respectively. A means (not shown) attached to the clamps moves the entire assembly into an exposing position between a pair of light banks exposure sources (18) and (18'). These light banks have 14 fluorescent light bulbs located in each bank. These bulbs (high intensity 48 inch, Du Pont P/N 276208-001, base RDC, bulb T12, E. I. du Pont de Nemours and Company, Wilmington, DE) are used to expose the photopolymer layer on both sides of the circuit board substrate through the appropriate photomask. Exposure is carried out for about 10 seconds. After exposure, the movement of the nip rolls is reversed and the exposed, composite element is removed from the device. The strippable support is removed from each imaged layer and copper powder having an average particle size of 11 microns is dusted onto the exposed surfaces and into the through-holes. Excess powder is removed by spraying with water to give a clean, clearly defined, catalyzed copper circuit pattern. The board is then immersed in an electroless copper plating solution (see Example II of Zeblisky et al., U.S. Pat. No. 3,095,309) and copper is deposited in the holes and on the circuit patterns for about 1 hour to form a complete, copper circuit.

Another layer of the same photopolymerizable material is laminated again over the copper circuit pattern just formed. A second photomask complimentary set of another desired circuit pattern is inserted at (16) and (16') in the automatic registration and exposing device and the just laminated element is again inserted as (11). The elements are wetted with water, contacted with the photomasks, exposed, the cover sheets removed, and copper powder applied as described above.

A third photomask set complimentary to the second set is inserted at (16) and (16') in the automatic registration and exposing device and the just imaged element with the copper powder patterns thereon is again inserted as (11). The elements are wetted with water, contacted with photomasks, exposed and the cover sheets removed as described above. The imaged sample is then developed in methyl chloroform as described in Example 1 of Peiffer U.S. Pat. No. 4,157,407 to remove the copper powder and photopolymerizable composition only in the areas which are not exposed to actinic radiation in either the second or third imaging exposure. This element is baked at 160°–165° C. for about 65 minutes and placed in the electroless copper plating solution for about 8 hours. The result is a multilayered printed circuit board with two printed circuit layers interconnected by plated through-holes sandwiched between and, except for electrical interconnects produced by design, electrically insulated from two additional printed circuit layers. All desired elements are in registry.

EXAMPLE 3

The following formulation is prepared:

5 g styrene/maleic acid anhydride copolymer 2 g triethylene glycol diacetate 100 ml acetone These ingredients are stirred to dissolve the solids and the following dihydropyridine compound is added:

(1 g) 2,4,6-trimethyl-3,5-bis (carb-terbutoxy)-1,4-dihydropyridine along with 2 g of the following hexarylbiimidazole compound: 2,2'-bis(2-chlorophenyl)-4,4',5,5'-tetraphenylbiimidazole. This solution is then coated on a polypropylene support and dried. The coated and dried sample is exposed under the same conditions as those described in Example 1 in a similar device using a screened negative yellow separation of a colored master copy for a photomask. Contact between the photomask and the photopolymer element is accomplished with water as described in Example 1. After exposure, the element is removed from the automatic registration and exposure device and the image developed using the same yellow toner described therein. Another photosensitive layer is then laminated over this yellow image and exposed in registry to yet another color separation as the photomask. The exposure is carried out in the same manner and the image developed using a cyan toner similar to that described in Example 1. The resulting image is a two-color copy of the original in registry.

EXAMPLE 4

A negative working color proof of the surprint type is made following the teaching of Cohen et al., U.S. Pat. No. 4,174,216, Example 2 and laminated to a Kromkote ® paper support as described therein. This element (designated as the substrate) is then exposed to a suitable halftone negative minus-blue color separation film record (designated as the photomask) in the same manner as described previously in this application (Example 1) using water as the liquid. The automatic registration and exposure device is used in this example also. The element is given about 10 seconds exposure and held for about 5 minutes after removal from the device. The energy treated clear cover sheet is removed and image photoadhered to the electrostatic discharge treated film thus exposing equivalent areas of negative, tacky elastomer contiguous layer. These bared areas are toned with the yellow toner of Example 1. Using a second photosensitive element, the release film is stripped off and contiguous layer is laminated to the surface of the yellow image just produced and this element is exposed in the automatic registration and exposing device using a negative minus-green color separation film record held in perfect registration by this device. This composite is exposed as described above and the surface treated cover sheet is stripped therefrom leaving bared a positive image which is toned with the magenta toner of Example 1. The process is repeated for the minus-red and black negative records to give a high quality surprint color proof useful in the lithographic printing arts. The images to be obtained are clear, sharp and in registry.

The automatic registration and exposure devices described in this invention are useful in the processes described in the examples, among others. A single device can be used to automatically register a multitude of photorecords one on top of the other. Alternatively, one might use a number of automatic devices in sequence to improve operability and product throughput. The unique features of this process utilize an ideal means to accomplish the registration and exposure and in addition utilize a unique manner of contact between the photosensitive element and the photomask—namely a relative unmoving liquid interface. It is thus possible to achieve multiple images on one or both sides of a suitable support all of which are in perfect alignment and registry. All of the elements described are useful within the lithographic industry to proof or check images prior to the actual printing. It is extremely important here that the final image be a true rendition or copy of the original so that satisfactory printing can result.

We claim:

1. A process of registering and imagewise exposing a sheet substrate containing a photosensitive layer with the use of a sequence of related photomasks comprising the steps of:
   (1) advancing the substrate containing a photosensitive layer to a position in a device to undertake in either order or concurrently the steps of:
      (a) aligning the substrate and a photomask of the sequence in a predetermined relationship to one another through a hinged relationship of the photomask and the substrate to permit substantially identical alignment of the substrate and each photomask of the sequence;
      (b) applying a liquid between the photosensitive layer and the photomask;
   (2) contacting through the liquid the substrate containing the photosensitive layer and the photomask wherein liquid between the photosensitive layer and the photomask is displaced when the substrate and photomask are brought into more intimate contact by an advancing pressure line whereby during said contacting substantially no movement of the photosensitive layer relative to the photomask occurs other than a more intimate contact due to displacement of the liquid in a liquid layer whereby at least one of interfacial or viscous force due to the liquid layer aids in holding the photosensitive layer and photomask in a fixed position relative to one another;
   (3) exposing the photosensitive layer to actinic radiation through said photomask, causing an image to be formed thereon;
   (4) removing the photomask from the exposed photosensitive layer;
   (5) modifying the surface of the exposed photosensitive layer;
   (6) repeating steps 1 to 5 for each of the remaining photomasks of said sequence.

2. The process of claim 1 wherein modifying the surface of the exposed photosensitive layer comprises an image intensification step.

3. The process of claim 2 wherein the image intensification step includes application of powdered toner or catalyst.

4. The process of claim 3 wherein powdered toner is applied.

5. The process of claim 1 wherein modifying the surface of the exposed photosensitive layer includes application of an additional photosensitive layer.

6. The process of claim 1 wherein modifying the surface of the exposed photosensitive layer includes both an image intensification step and application of an additional photosensitive layer; provided however a photosensitive layer need not be applied after use of the last photomask of said sequence.

7. The process of claim 1 wherein steps 1 to 5 are repeated four separate times to obtain a four-color surprint proof.

8. The process of claim 1 wherein a printed circuit board is obtained.

9. The process of claim 1 wherein both sides of the sheet substrate contain photosensitive layers and are exposed to actinic radiation.

10. The process of claim 1 wherein said advancing pressure line employs a nip.

11. The process of claim 1 wherein the application of liquid is to a substrate surface held in a substantially vertical plane.

12. The process of claim 1 wherein steps 1 to 4 are with the substrate surface held in a substantially vertical plane.

13. The process of claim 1 with the substrate held in a substantially vertical plane.

14. The process of claim 1 wherein the photosensitive layer is positive working.

15. The process of claim 1 wherein the photosensitive layer is negative working.

16. The process of claim 1 wherein the photosensitive layer contains a photohardenable component.

17. The process of claim 1 wherein the photosensitive layer contains a photohardenable addition polymerizable component.

18. The process of claim 17 wherein the photohardenable component is photocrosslinkable or photodimerizable.

19. The process of claim 1 wherein the photomask is flexible.

20. The process of claim 1 without a support or cover sheet present to separate the substrate from the photomask.

21. The process of claim 1 wherein the photosensitive layer is separated from the liquid layer by a support or cover sheet which allows actinic radiation to pass.

22. The process of claim 1 wherein the liquid comprises water.

23. The process of claim 1 wherein in step (2) registration contact is made by precise alignment of details contained on the substrate containing the photosensitive layer or substrate carrier with details on the photomask.

24. The process of claim 1 wherein in step (1) (b) an excess of liquid is provided compared to the amount used to separate the substrate containing the photosensitive layer and the photomask in the subsequent operation of step (2) and whereby in step (2) a cleaning action is achieved on both the photosensitive layer and photomask by the use of excess liquid.

25. The process of claim 23 wherein in step (1) (b) an excess of liquid is provided compared to the amount used to separate the substrate containing the photosensitive layer and the photomask in the subsequent operation of step (2) and whereby in step (2) a cleaning action is achieved on both the photosensitive layer and photomask by the use of an excess of liquid.

26. A process of registering and imagewise exposing a sheet substrate containing a photosensitive layer with a sequence of related photomasks in making a four-color surprint comprising the steps of:
  (1) advancing the substrate containing a first photosensitive layer to a position in a device to undertake either in order or concurrently the steps of:
    (a) aligning the substrate and a first photomask of the sequence in a predetermined relationship to one another through a hinged relationship of the photomask and the substrate to permit substantially identical alignment of the substrate and each photomask of the sequence;
    (b) applying a liquid between the substrate containing the photosensitive layer and the photomask;
  (2) contacting through the liquid the substrate containing the photosensitive layer and the photomask wherein liquid between the photosensitive layer and the photomask is displaced when the substrate and photomask are brought into more intimate contact by an advancing pressure line, whereby during said contacting substantially no movement of the photosensitive layer relative to the photomask occurs other than a more intimate contact due to displacement of the liquid in a liquid layer whereby at least one of interfacial or viscous force due to the liquid layer aids in holding the photosensitive layer and photomask in a fixed position relative to one another;
  (3) exposing the photosensitive layer to actinic radiation through said photomask, causing an adherent image to be formed on the substrate;
  (4) removing the photomask from the exposed photosensitive layer;
  (5) developing the adherent image on the substrate by application of a particulate colorant;
  (6) applying a further photosensitive layer to the exposed substrate whereby steps 1 to 5 can be repeated with a further photomask of said sequence; and
  (7) repeating steps 1 to 6 for each of the remaining photomasks of said sequence;
whereby a four-color surprint is obtained; provided, however, step (6) need not be employed with use of the last photomask.

27. The process of claim 26 wherein a support or cover sheet is present between the photosensitive layer and the photomask and is removed after step 4 and before step 5.

* * * * *